US010973125B2

(12) United States Patent
Brown et al.

(10) Patent No.: US 10,973,125 B2
(45) Date of Patent: Apr. 6, 2021

(54) FLEX BOARD SPACER

(71) Applicant: Hamilton Sundstrand Corporation, Charlotte, NC (US)

(72) Inventors: Ricardo O. Brown, West Hartford, CT (US); Michael Andreozzi, Elk Grove Village, IL (US); Ben Fisher, Rockford, IL (US); Loren O. Brandenburg, Stafford Springs, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 16/456,509

(22) Filed: Jun. 28, 2019

(65) Prior Publication Data
US 2020/0413540 A1    Dec. 31, 2020

(51) Int. Cl.
*H05K 1/14*    (2006.01)
(52) U.S. Cl.
CPC ..... *H05K 1/148* (2013.01); *H05K 2201/2036* (2013.01)
(58) Field of Classification Search
CPC ............ H05K 1/02; H05K 1/021; H05K 1/14; H05K 1/141–144; H05K 1/18; H05K 1/181–188; H05K 3/361–368; H05K 5/0217; H05K 5/0069
USPC ................ 361/749, 770–790, 803, 807–810; 174/254–260
See application file for complete search history.

(56) References Cited

U.S. PATENT DOCUMENTS

| | | | | |
|---|---|---|---|---|
| 5,161,981 A | * | 11/1992 | Deak .................. | H01R 12/62 439/491 |
| 5,434,362 A | * | 7/1995 | Klosowiak ........... | H05K 1/028 174/254 |
| 6,520,789 B2 | * | 2/2003 | Daugherty, Jr. ...... | H01R 9/096 439/329 |
| 6,655,017 B1 | * | 12/2003 | Formwalt, Jr. ...... | H05K 5/0043 29/564.6 |

(Continued)

FOREIGN PATENT DOCUMENTS

| | | |
|---|---|---|
| DE | 4429984 C1 | 12/1995 |
| EP | 0827372 A2 | 3/1998 |
| EP | 1152649 A2 | 11/2001 |

OTHER PUBLICATIONS

Extended European search report issued in corresponding EP application No. 19214564.7, dated Jul. 13, 2020.

*Primary Examiner* — Tuan T Dinh
(74) *Attorney, Agent, or Firm* — Locke Lord LLP; Scott D. Wofsy; Georgi Korobanov

(57) ABSTRACT

A spacer for providing support to a flex board including a spacer body having, a first portion including multiple surfaces on a first side thereof and multiple surfaces on a second side opposite the first side, a second portion including multiple surfaces on a first side thereof and multiple surfaces on a second side opposite the first side, wherein the second portion is connected to the first irregular portion by a bridge having a single surface on a first side thereof and multiple surfaces on a second side opposite the first side and a set of orifices each for receiving a fastener therein, wherein at least one of the orifices is located on the first side of the first portion and at least one of the orifices is located on the first side of the second portion.

15 Claims, 3 Drawing Sheets

(56) References Cited

U.S. PATENT DOCUMENTS

| | | | |
|---|---|---|---|
| 6,822,878 B2* | 11/2004 | Dobbs | H05K 1/148 |
| | | | 361/752 |
| 7,265,719 B1* | 9/2007 | Moosbrugger | H01Q 21/0025 |
| | | | 343/700 MS |
| 9,955,596 B2* | 4/2018 | Voss | H05K 3/368 |
| 10,051,732 B2 | 8/2018 | Verhoee et al. | |
| 10,231,337 B2* | 3/2019 | Johnson | H05K 1/148 |
| 10,236,609 B2 | 3/2019 | Tziviskos et al. | |
| 2005/0056457 A1* | 3/2005 | Gall | H05K 1/0281 |
| | | | 174/254 |
| 2014/0009889 A1 | 1/2014 | Lee et al. | |
| 2015/0173193 A1* | 6/2015 | Vanderveen | H01R 12/737 |
| | | | 361/749 |
| 2015/0261265 A1* | 9/2015 | Dean | G01R 1/0408 |
| | | | 361/679.31 |
| 2018/0027671 A1* | 1/2018 | Kang | G06F 1/1601 |
| | | | 361/707 |
| 2019/0082538 A1 | 3/2019 | Hoang et al. | |
| 2019/0110366 A1 | 4/2019 | Gavagnin et al. | |

* cited by examiner

FLEX BOARD SPACER

BACKGROUND

Technological Field

The present disclosure relates to a flex board, and more particularly to a flex board spacer.

Description of Related Art

Some flex boards, which carry signals and power from external aircraft connectors to the internal daughter cards get folded in half to be used to interface external connectors to internal module assemblies. Certain flex boards also use metal sleeves as spacers at the four corners of the board. A current challenge with metal sleeves as spacer has been cracking of the connectors during use.

The conventional methods and systems have generally been considered satisfactory for their intended purpose. However, there is still a need in the art for a spacer having improved support capabilities. There also remains a need in the art for such spacer that is economically viable. The present disclosure may provide a solution for at least one of these remaining challenges.

SUMMARY OF THE INVENTION

A spacer for providing support to a flex board. A flex board includes a first board including a set of electronic inputs and outputs, a second board including inputs and outputs corresponding to the inputs and outputs of the first portion connected to the first portion by a flexible connector the spacer fastened to the first portion for providing stiffness to the flex board, wherein the spacer contacts only a portion of the first board, and contacts only a portion of the second board when assembled. The spacer includes a spacer body a first portion including multiple first surfaces facing a first direction and multiple second surfaces facing a second direction, the second direction being opposite to the first direction, a second portion including multiple third surfaces facing the first direction and multiple fourth surfaces facing the second direction, a bridge positioned between the first portion and the second portion having at least one surface facing the first direction and at least one surface facing the second direction, the spacer body being sized and configured such that the multiple first through sixth surfaces contact parts of a first board and a second board of a flex board when assembled to the flex board to provide stiffness to the flex board, and a plurality of orifices each for receiving a fastener therein.

The bridge can include four standoffs on the second side. The second portion can include a fully encircled void. The orifices can be co-planar. The second portion can include two orifices, each flush with a surface of the second portion.

The first portion can include two orifices, each orifice located within a distinct corresponding standoff from a surface of the first portion defining a majority of the first portion. Each of the standoffs can be vertically oriented. The first portion as well as the second portion can be asymmetrical in a lengthwise and widthwise direction. The spacer body can be a single continuous monolithic, integral structure. The spacer can be manufactured using additive manufacturing methods. The first portion and the second irregular portion can include a non-conductive material.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject invention appertains will readily understand how to make and use the devices and methods of the subject invention without undue experimentation, preferred embodiments thereof will be described in detail herein below with reference to certain figures, wherein.

DETAILED DESCRIPTION

Figure 1:
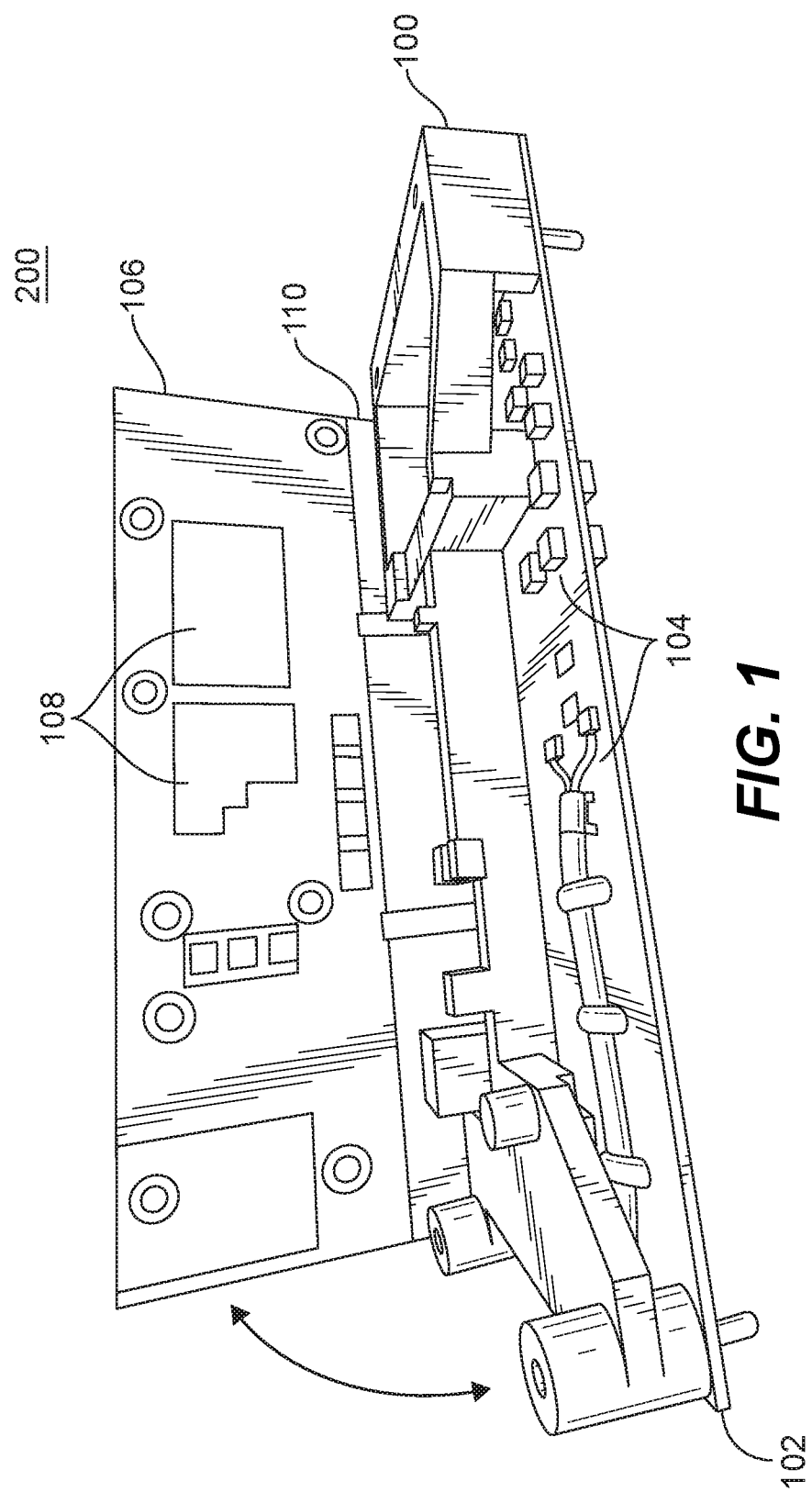
FIG. 1 is a perspective view of a flex board in an unfolded position showing the spacer.

Reference will now be made to the drawings wherein like reference numerals identify similar structural features or aspects of the subject invention. For purposes of explanation and illustration, and not limitation, a partial view of an exemplary embodiment of a spacer in accordance with the invention is shown in FIG. 1 and is designated generally by reference character 100. Other embodiments of the spacer in accordance with the invention, or aspects thereof, are provided in FIGS. 2-3, as will be described. The methods and systems of the invention can be used to improve the reliability and lifetime of the flex board.

FIG. 1 shows a flex board 200 for an aircraft electronics module. This flex board 200 is designed to carry signals and power from an external aircraft connector 102 to an internal daughter cards 106. The flex board 200 also provides EMI and lightning filtering for these signals. The flex board 200 includes the external aircraft connector 102 or a first half or a first board 102 including a set of electronic inputs and outputs 104 and the internal daughter card 106 or a second board 106 including inputs and outputs 108 corresponding to the inputs and outputs 104 of the first board 102. The first board 102 is connected to the second board 106 by a flexible connector 110. The flexible connector 110 connects the boards lengthwise and allows them to fold onto each other. A spacer 100 fastened to the first board 102, provides stiffness to the flex board 200 and ensures that inputs and outputs 104/108 are not being crushed or damaged by external pressures. when the board 200 is folded together In order to provide enough support the spacer 100 contacts each of the boards 102/104 in at least three spaced apart and distinct locations.

Figure 2:
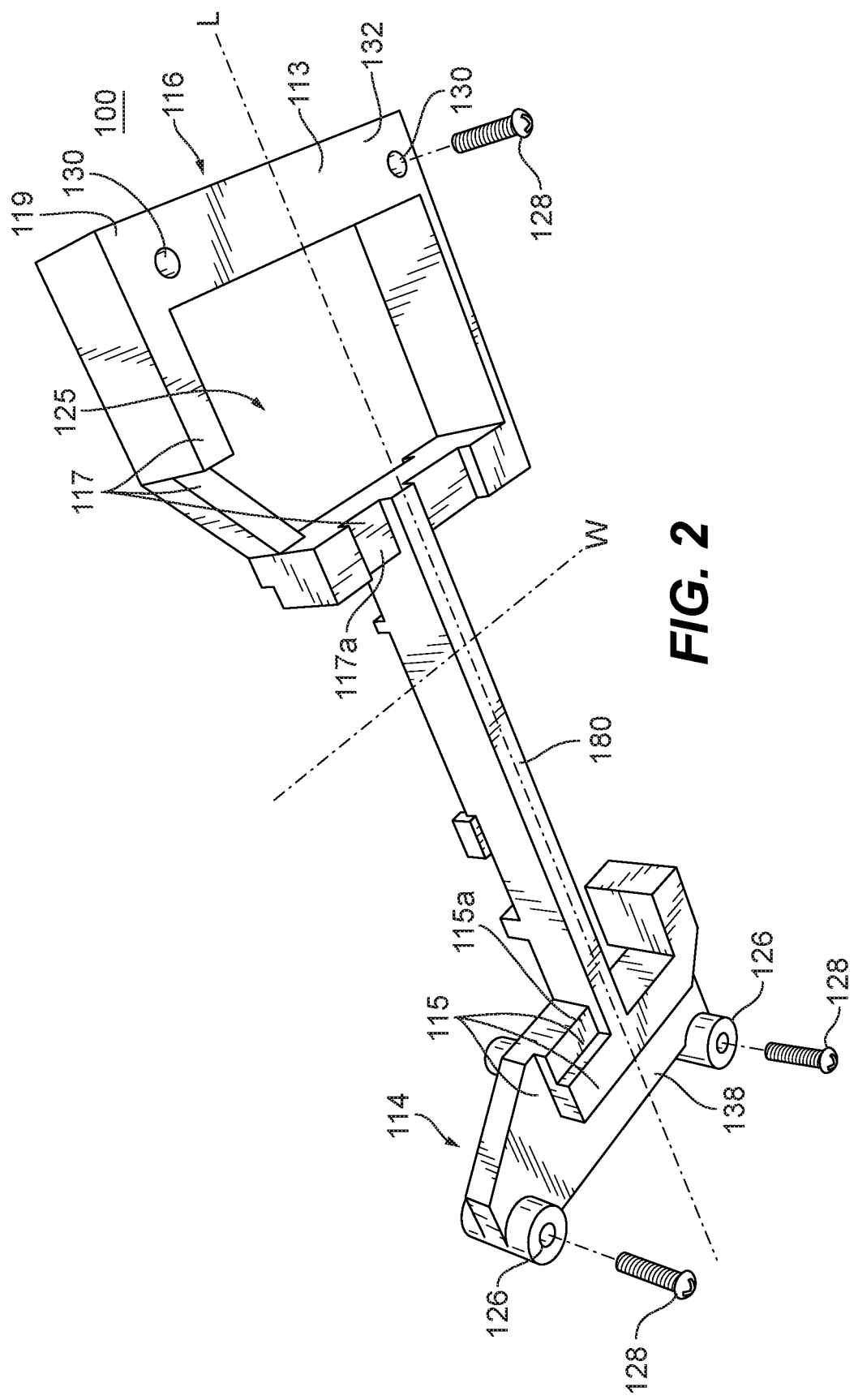
FIG. 2 is a perspective view the spacer of FIG. 1, showing the first side.

FIG. 2 shows the spacer 100 from a first side 113, a single continuous monolithic, integral structure, which is made using additive manufacturing methods using a non-conductive material. The spacer 100 includes a first portion 114, which includes multiple surfaces 115 at varying elevations on the first side 113 and multiple surfaces on a second side 213 opposite the first side (shown in FIG. 3). The elevations can be vertical elevations. A second portion 116 also includes multiple surfaces 117 on a first side thereof 119, similarly at varying vertical elevations. The first portion 114 and the second portion 116 are asymmetrical in both the lengthwise and widthwise directions. Intermediate elevations of the surfaces of first portion 115a and the elevations of the surfaces of the second portions 117a do not have to be equal or at the same heights. The second side 120 of the second portion 116 similarly includes multiple surfaces (shown in FIG. 3). The second portion 116 is connected to the first portion 114 by a bridge 122. The bridge 122 includes only a single surface 180 at a single elevation on a first side 123 thereof and multiple surfaces on a second side 124 (shown in FIG. 3). The second portion 116 of the spacer includes a fully encircled void 125.

Further shown in FIG. 2, the spacer 100 includes a set of orifices 126/130. The orifices 126/130 receive fastener 128 therein in order to attach the spacer 100 to the first board 102. The orifices are co-planar and located at the same elevation. Each portion 114/116 includes two orifices each. The orifices of the second portion 130 are flush with a surface 132 of the second portion 116. The orifices 130 are embedded within the second portion 116. The two orifices of the first portion 126 are embedded within a distinct standoff 126a from the first portion 114. The standoffs are at a different elevation of a surface 138, which defines a majority of the surface area of the first portion 114.

Figure 3:
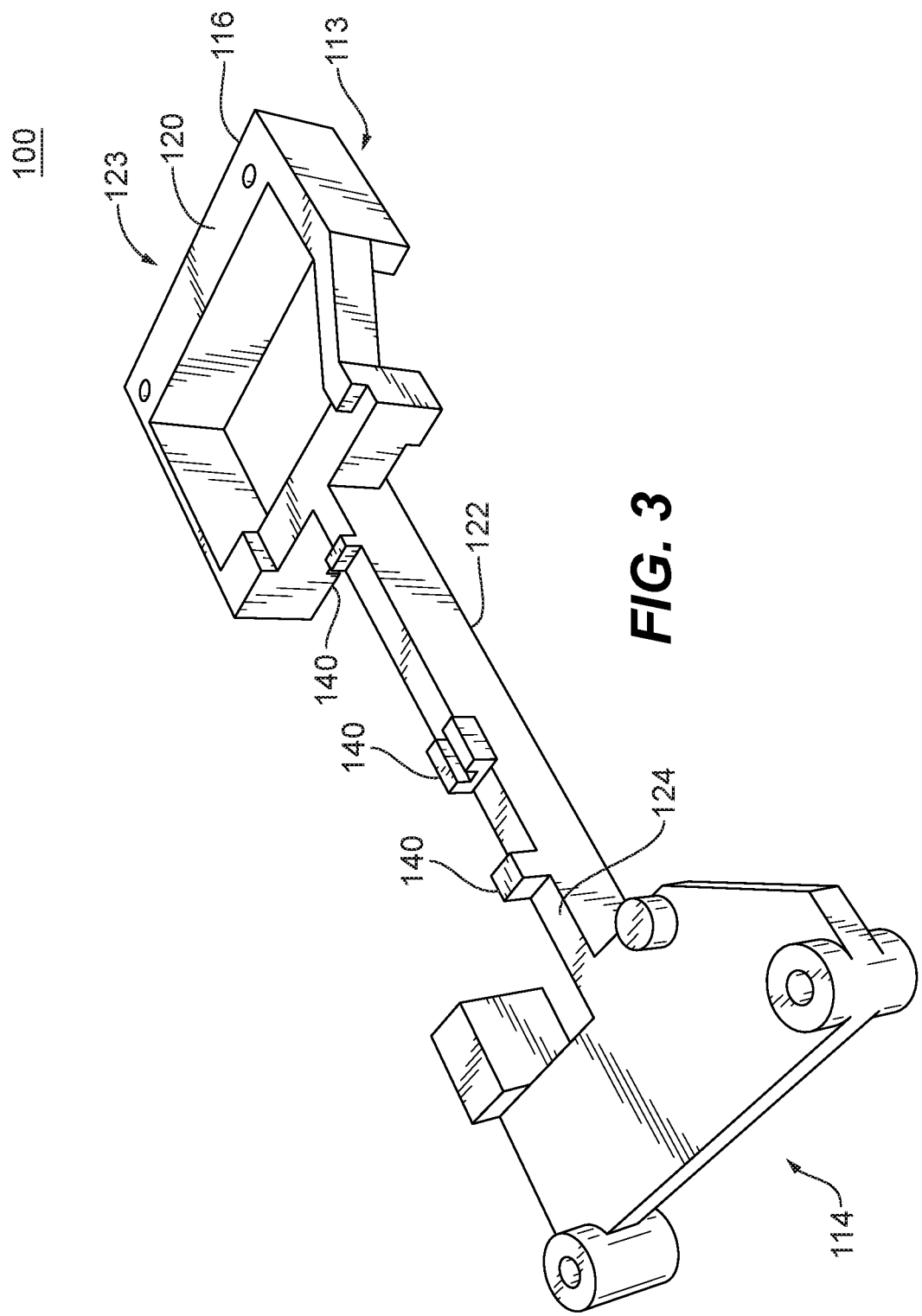
FIG. 3 is a perspective view the spacer of FIG. 1, showing the second side.

FIG. 3 shows the bridge 122 includes four distinct standoffs 140 on the second side 124. The standoffs 140 are the only elevation changes on the second side 124 of the bridge 122.

The present disclosure, as described above and shown in the drawings, provide for a spacer with superior properties including increased reliability and stability, and reduced size, weigh, and manufacturing cost. While the apparatus and methods of the subject disclosure have been showing and described with reference to embodiments, those skilled in the art will readily appreciate that changes and/or modifications may be made thereto without departing from the spirit and score of the subject disclosure.

What is claimed is:

1. A spacer for providing support to a flex board comprising:
   a spacer body including:
   a first portion including multiple first surfaces facing a first direction and multiple second surfaces facing a second direction, the second direction being opposite to the first direction;
   a second portion including multiple third surfaces facing the first direction and multiple fourth surfaces facing the second direction;
   a bridge positioned between the first portion and the second portion having at least one surface facing the first direction and at least one surface facing the second direction, the spacer body being sized and configured such that multiple surfaces contact parts of a first board and a second board of a flex board when assembled to the flex board to provide stiffness to the flex board, wherein the bridge includes four standoffs on the surface facing the second direction; and
   a plurality of orifices each for receiving a fastener therein.

2. The spacer of claim 1, wherein the second portion includes a fully encircled void.

3. The spacer of claim 1, wherein the orifices are co-planar.

4. The spacer of claim 1, wherein the first portion includes two orifices, each orifice located within a distinct corresponding standoff from a surface of the first portion defining a majority of the first portion.

5. The spacer of claim 1, wherein the first portion is asymmetrical in a lengthwise and widthwise direction.

6. The spacer of claim 1, wherein the spacer body is a single continuous monolithic, integral structure.

7. The spacer of claim 1, wherein the first portion and the second irregular portion include a non-conductive material.

8. The spacer of claim 3, wherein the second portion includes two orifices, each flush with a surface of the second portion.

9. The spacer of claim 4, wherein each of the standoffs are vertically oriented.

10. The spacer of claim 5, wherein second portion is asymmetrical in the lengthwise and widthwise directions.

11. The spacer of claim 1, wherein the spacer is manufactured using additive manufacturing methods.

12. A flex board comprising:
   a first board including a set of electronic inputs and outputs;
   a second board including inputs and outputs corresponding to the inputs and outputs of the first board connected to the first board by a flexible connector;
   a spacer fastened to the first board for providing stiffness to the flex board, wherein the spacer contacts only a portion of the first board, and contacts only a portion of the second board when assembled;
   a first portion including multiple surfaces facing a first direction and multiple surfaces facing a second direction, the second direction being opposite to the first direction;
   a second portion including multiple third surfaces facing the first direction and multiple fourth surfaces facing the second direction;
   a bridge positioned between the first portion and the second portion having at least one surface facing the first direction and at least one surface facing the second direction, the spacer body being sized and configured such that multiple surfaces contact parts of the first board and the second board of the flex board when assembled to the flex board to provide stiffness to the flex board; and
   a plurality of orifices each for receiving a fastener therein.

13. The flex board of claim 12, wherein the spacer contacts each of the boards in at least three spaced apart locations.

14. The flex board of claim 12, wherein the second portion includes two orifices, each flush with a surface of the second portion, and wherein the first portion includes two orifices.

15. The flex board of claim 14, wherein each orifice of the first portion is located within a distinct corresponding standoff from a surface of the first portion defining a majority of the first portion.

* * * * *